US006271093B1

(12) United States Patent
Alsmeier et al.

(10) Patent No.: US 6,271,093 B1
(45) Date of Patent: *Aug. 7, 2001

(54) METHODS FOR REDUCING ANOMALOUS NARROW CHANNEL EFFECT IN TRENCH-BOUNDED BURIED-CHANNEL P-MOSFETS

(75) Inventors: Johan Alsmeier, Wappingers Falls; Jack Allan Mandelman, Stormville, both of NY (US)

(73) Assignees: Siemens Aktiengesellschaft, Munich (DE); International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 08/625,962

(22) Filed: Apr. 1, 1996

Related U.S. Application Data

(60) Division of application No. 08/351,924, filed on Dec. 8, 1994, now abandoned, which is a continuation-in-part of application No. 08/269,857, filed on Jun. 30, 1994, now Pat. No. 5,559,050.

(51) Int. Cl.[7] .................................................. H01L 21/336

(52) U.S. Cl. .......................... 438/282; 438/289; 438/296; 438/224

(58) Field of Search ..................................... 437/40 R, 34, 437/56, 57, 58, 913, 41 R; 438/221, 223, 224, 225, 227, 228, 289, 296

(56) References Cited

U.S. PATENT DOCUMENTS

| 4,784,975 | * | 11/1988 | Hofmann et al. | 437/247 |
|---|---|---|---|---|
| 4,833,096 | * | 5/1989 | Huang et al. | 437/34 |
| 5,023,193 | * | 6/1991 | Manolin et al. | 437/34 |
| 5,024,962 | * | 6/1991 | Murray et al. | 437/239 |
| 5,091,324 | * | 2/1992 | Hsu et al. | 438/227 |
| 5,294,571 | * | 3/1994 | Fujishiro et al. | 437/239 |
| 5,320,975 | * | 6/1994 | Cederbaum et al. | 257/69 |
| 5,384,279 | * | 1/1995 | Stolmeijer et al. | 438/217 |
| 5,559,050 | * | 9/1996 | Alsmeier et al. | 438/289 |

OTHER PUBLICATIONS

Bryant et al, "The Current–Carrying Corner Inherent to Trench Isolation", IEEE Electron Device Lett. vol 14 No. 8, pp. 412–414, Aug. 1993.*

(List continued on next page.)

*Primary Examiner*—Michael Trinh
(74) *Attorney, Agent, or Firm*—Stanton C. Braden

(57) ABSTRACT

Methods of manufacturing trench-bounded buried-channel p-type metal oxide semiconductor field effect transistors (p-MOSFETs), as used in dynamic random access memory (DRAM) technologies, for significantly reducing the anomalous buried-channel p-MOSFET sensitivity to device width. In one embodiment, the method comprises the initiation of a low temperature annealing step using an inert gas after the deep phosphorous n-well implant step, and prior to the boron buried-channel implant and 850° C. gate oxidation steps. Alternatively, the annealing step may be performed after the boron buried-channel implant and prior to the 850° C. gate oxidation step. In another embodiment, a rapid thermal oxidation (RTO) step is substituted for the 850° C. gate oxidation step, following the deep phosphorous n-well and boron buried-channel implant steps. Alternatively, an 850° C. gate oxidation step may follow the RTO gate oxidation step.

6 Claims, 5 Drawing Sheets

OTHER PUBLICATIONS

Davari et al, "A Variable Size Shallow Trench Isolation . . . for SubMicron CMOS", IEDM Technical Digest, pp. 92–95 (1988).*

Wolf et al, "Silicon Processing for the VLSI Era", vol 1, pp 209–210, 216, 305–307, 1986.*

Chung et al, "An Analytical Threshold Voltage Model of Trench Isolated MOS devices with Nonuniformly Doped Subtrates", IEEE Transactions on Electron Dev., vol. 39, No. 3, Mar. 1992, pp 614–622.*

* cited by examiner

METHODS FOR REDUCING ANOMALOUS NARROW CHANNEL EFFECT IN TRENCH-BOUNDED BURIED-CHANNEL P-MOSFETS

This is divisional of application Ser. No. 08/351,924 filed Dec. 8, 1994, abandoned, which is a continuation-in-part of U.S. Ser. No. 08/269,857 filed Jun. 30, 1994, now U.S. Pat. No. 5,559,050.

BACKGROUND OF THE INVENTION

1. Field of the Invention

The present invention generally relates to methods of manufacture of trench-bounded buried-channel p-type metal oxide semiconductor field effect transistors (p-MOSFETs) as used in dynamic random access memory (DRAM) technologies and, more particularly, to methods for significantly reducing the anomalous buried-channel p-MOSFET sensitivity to device width.

2. Description of the Prior Art

Corner conduction in trench isolated n-channel MOSFETs, as reported by A. Bryant, W. Haensch, S. Geissler, J. Mandelman, D. Poindexter, and M. Steger in "The Current-Carrying Corner Inherent to Trench Isolation", *IEEE Electron Device Letters*, vol. 14, no. 8, pp. 412–414 (1993), and B. Davari, C. Koburger, T. Furukawa, Y. Taur, W. Noble, J. Warnock, and J. Mauer in "A Variable-Size Shallow Trench Isolation (STI) Technology with Diffused Sidewall Doping for Submicron CMOS", 1988 *IEDM Technical Digest*, pp. 92–95 (1988), could be a significant contributor to standby current in low standby power ultra large scale integration (ULSI) applications. A manifestation of corner conduction is inverse narrow channel effect when the standard current definition of threshold voltage, $V_t$, $$\left(I_{V_t} = 40 \times \left(\frac{W_{des}}{L_{des}}\right) nA\right),$$

is applied, where $W_{des}$ and $L_{des}$ are the design width and design length of the device, respectively. Using $V_t$ defined by the above equation, inverse narrow channel effect is characterized by a decrease in the magnitude of $V_t$ as the width of the device decreases.

However, corner conduction in buried-channel p-MOSFETs has not, heretofore, been recognized as a concern. In buried-channel p-MOSFETs, the polarity of the work function difference between the N+ poly gate and the buried p-layer depletes the buried layer of carriers at low gate voltages. Due to the geometrically enhanced field at the silicon corner, it is expected that, when doping is uniform across the device width, the magnitude of $V_t$ at the corners of these devices is greater than at mid-channel. This leads to a normal channel effect, wherein the magnitude of $V_t$ increases with decreasing width of the device.

An anomalous (or inverse) narrow channel behavior has been observed in trench-bounded buried-channel p-MOSFETs (as used in contemporary DRAM technologies). Specifically, it has been observed that the magnitude of the threshold voltage, $V_t$, drops by approximately 100 mV when going from a device width of 20 µm down to 2 µm. The magnitude of $V_t$ drops more rapidly with further width reduction to approximately 0.4 µm. For devices narrower than 0.4µm, the expected normal narrow channel effect is observed, that is, the magnitude of $V_t$ increases with decreasing width of the device.

If the buried-channel boron dose is decreased to assure that the off-current is less than or equal to the objective over the entire range of design widths, the performance of the widest devices is compromised as a result of the higher than desired $V_t$. Consequently, to assure that the narrowest devices meet the off-current objective, the magnitude of the $V_t$ of the widest devices must be set higher than required by the off-current objective. This results in a performance penalty for the wider devices of typically a 100 mV loss of overdrive.

SUMMARY OF THE INVENTION

It is therefore an object of the present invention to provide a method of minimizing the anomalous channel effect and resulting sensitivity to device width.

To achieve these and other advantages and in accordance with the purpose of the invention embodied and broadly described herein, in one embodiment of the invention, there is provided a method for eliminating the anomalous channel effect including the steps of implanting at least one deep phosphorous n-well; initiating a low temperature anneal using an inert gas; implanting a boron buried-channel; and initiating a gate oxidation. The low temperature annealing step is performed at about 750° C. to about 800° C., for a period of about 10 minutes to about 120 minutes, and utilizes an inert gas, such as, for example, nitrogen or argon. Alternatively, the low temperature anneal may be performed after implanting the boron buried-channel and prior to initiating the gate oxidation.

In another aspect of the invention, there is provided a method for eliminating the anomalous channel effect including the steps of implanting at least one deep phosphorous n-well; implanting a boron buried-channel; and initiating a rapid thermal oxidation (RTO) gate oxidation step. The RTO is performed at about 1025° C. to about 1075° C. for a period of time sufficient to grow the gate oxide. In still another aspect of the invention, the RTO step may be followed by a standard gate oxidation step performed at about 850° C.

It is to be understood that both the foregoing general description and the following detailed description are exemplary and explanatory and are intended to provide further explanation of the invention as claimed.

BRIEF DESCRIPTION OF THE DRAWINGS

The foregoing and other objects, aspects and advantages will be better understood from the following detailed description of the embodiments of the invention with reference to the drawings, in which.

DETAILED DESCRIPTION OF AN EMBODIMENT OF THE INVENTION

Figure 1:
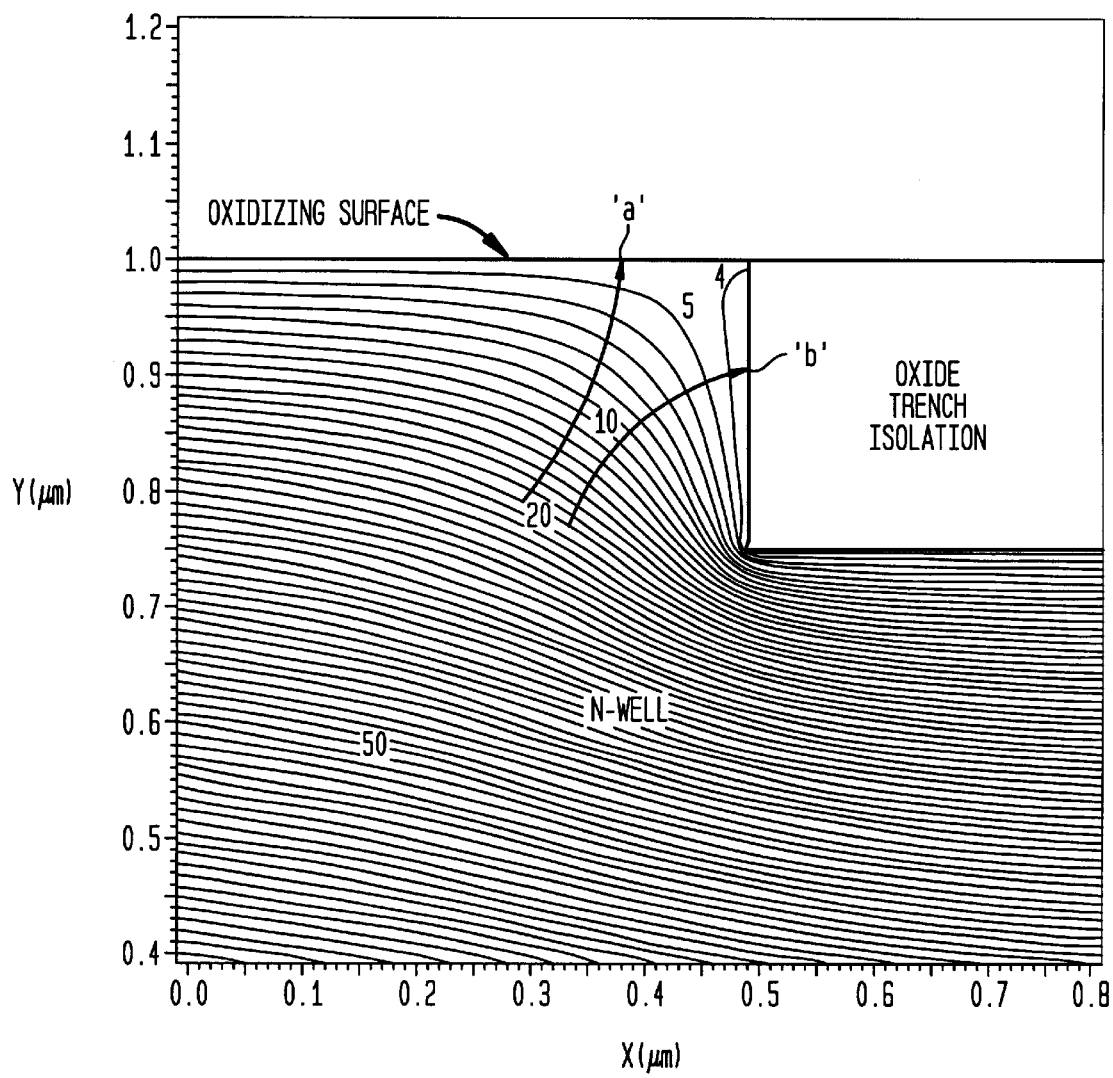
FIG. 1 is a graph superimposed on a cross-section of a portion of an oxide trench isolation showing interstitial (excess) contours at the beginning of an 850° C. gate oxidation step using process recipe "A"

In a standard 0.25 µm CMOS process, a 15 minute, 850° C. dry gate oxidation step immediately follows the n-well and boron buried-channel implants (referred to as process recipe "A"). As a result of damage from the deep phosphorous n-well implant ($2.5 \times 10^{13} \text{cm}^{-2}$, 500 keV) used for latchup suppression, a high concentration source of excess interstitials is created approximately 0.8 μm beneath the silicon surface. Since the trench sidewall and top surface of the device are efficient sinks for excess interstitials, an interstitial gradient, shown in FIG. 1, is established. Heavy arrows 'a' and 'b' depict the direction of the interstitial flux.

The interstitial gradient towards the interfaces, driven by implant induced damage, is created despite interstitial injection at the oxidizing top surface. Under intrinsic diffusion conditions, the dependence of the boron flux on the excess interstitial concentration can be approximated as $$\vec{J}_B = -D_B \left[ \left(\frac{I}{I^*}\right) \vec{\nabla} B + B \vec{\nabla} \left(\frac{I}{I^*}\right) \right],$$

where $D_B$ is the boron diffusivity, and $$\frac{I}{I^*}$$

and B are the excess interstitial and boron concentrations, respectively.

Figure 2:
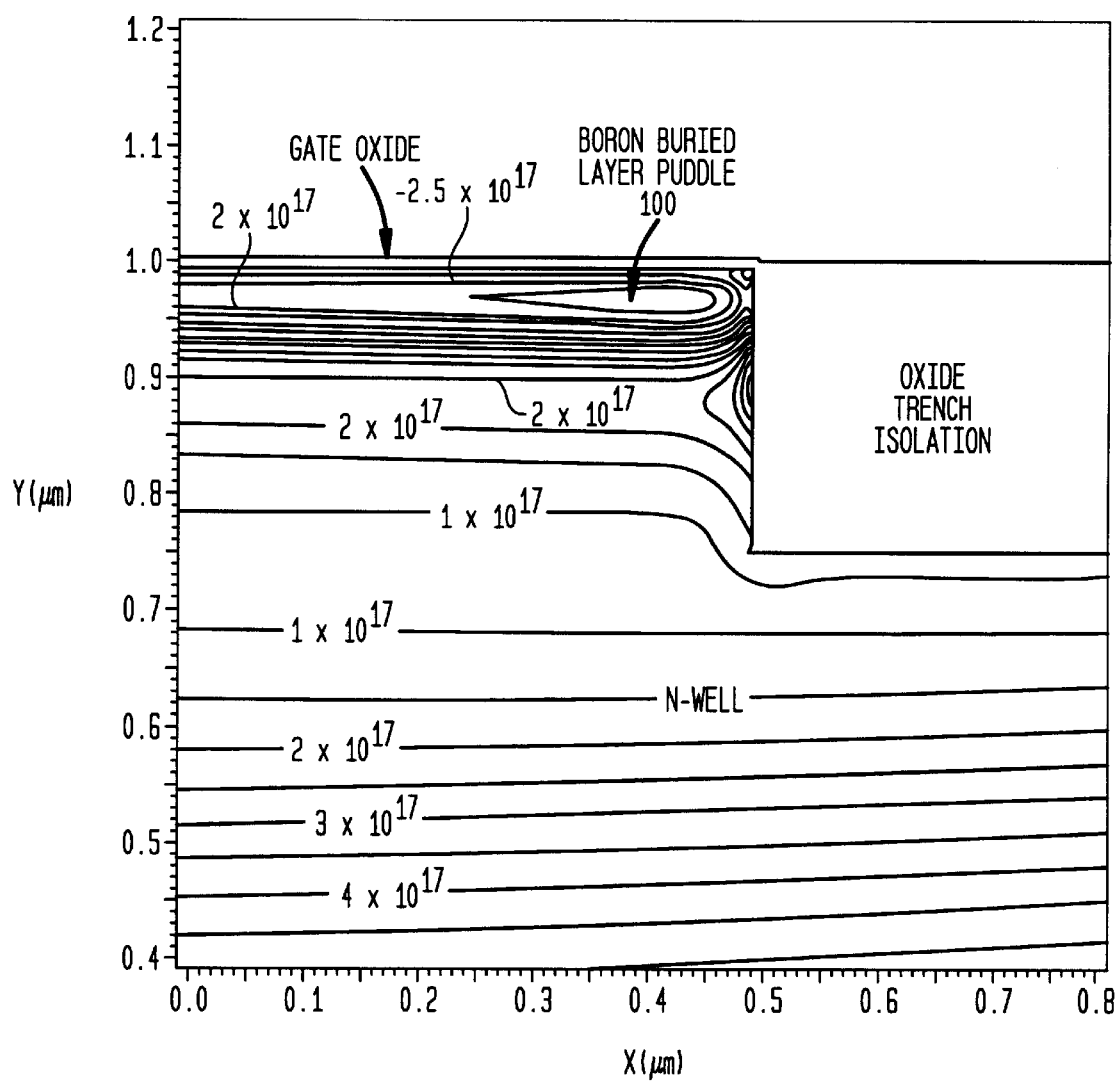
FIG. 2 is a cross-section similar to FIG. 1 showing the boron buried layer puddle responsible for anomalous $V_t$ dependence on channel width using process recipe "A"

Moving along the peak of the boron buried-layer (approximately 30 nm deep) from trench edge towards mid-width, the excess interstitial concentration and, hence, the boron diffusivity, increase and the boron distribution broadens. The minimum in the peak net p-type concentration of the buried layer occurs at mid-width and is accentuated by the compensation of boron by the n-well doping. Furthermore, the gradient in the excess interstitial concentration drives the boron towards the trench edge. Within approximately 30 nm of the trench edge, segregation induced boron depletion and type dopant pile-up reduce the net p-type concentration. The overall effect of the excess interstitial distribution on the diffusion of boron during the 850° C. gate oxidation step is the creation of a "boron puddle" 100 near the trench edge, as shown by the simulated net doping distribution at the end of the process in FIG. 2.

Modeling shows that the peak net p-type concentration in the "boron puddle" is approximately 32% greater than at mid-width, for a 2 μm wide device. As the device width is reduced down to approximately 0.4 μm, the peak net p-type concentration increases because of decreased interstitial concentration at the top surface resulting from recombination on the trench sidewall.

Figure 3:
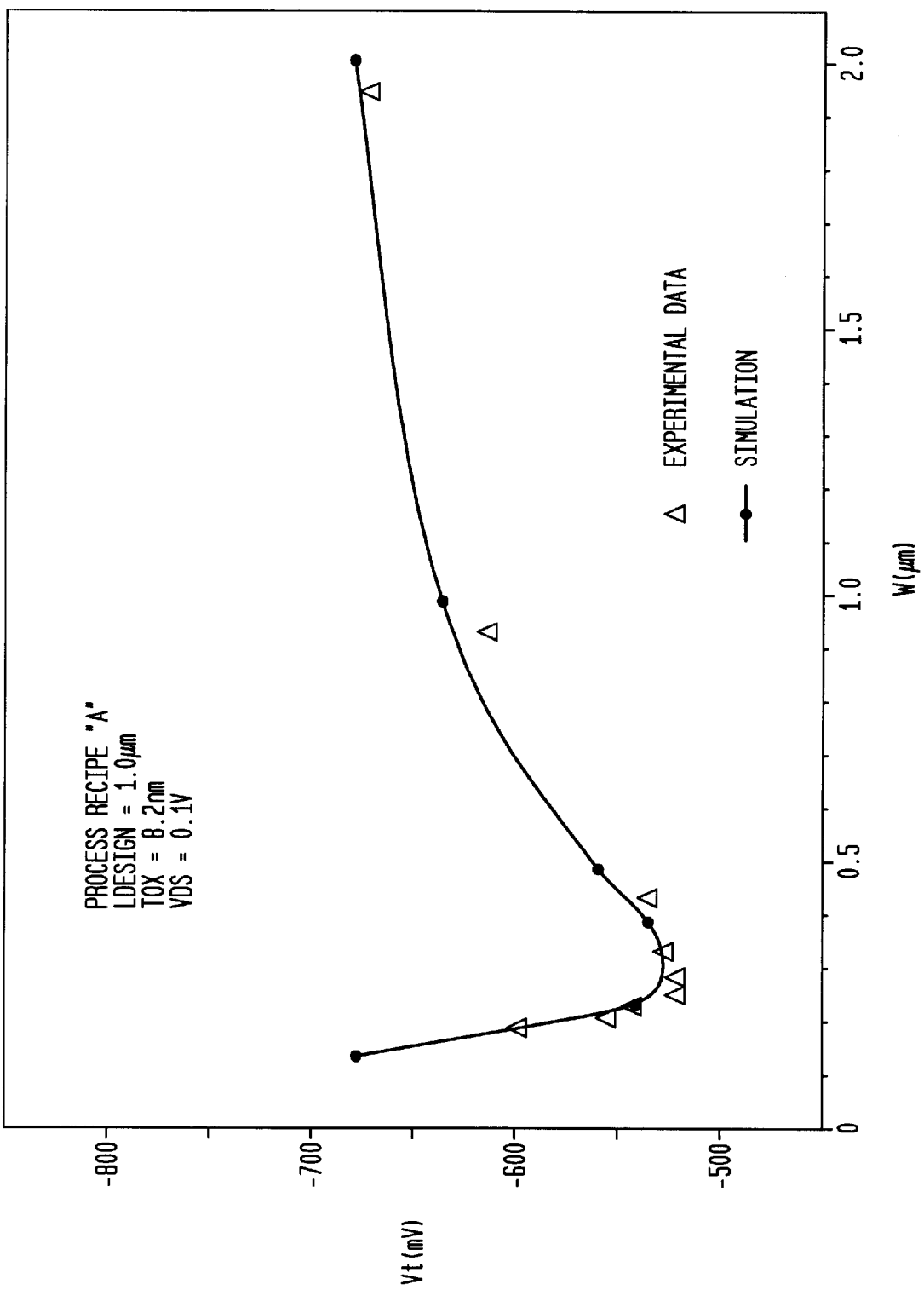
FIG. 3 is a graph showing measured and modeled $V_t$ versus width (W) for process recipe "A" demonstrating the anomalous $V_t$ dependence on width down to ≈0.4 µm.

For still narrower devices, the effect of the n-type dopant pileup on the trench sidewall reduces the buried layer concentration. FIG. 3 shows measured $V_t$ versus W (width) characteristics compared with simulated results. As illustrated in FIG. 3, the magnitude of $V_t$ drops by approximately 150 mV when the device width is reduced from 2 μm to 0.4 μm. This results in a loss of overdrive of approximately 100 mV for the widest channel p-FETS used in a design.

It is noteworthy that evidence of a comparable boron puddle for the n-MOSFET is neither observed experimentally nor predicted by modeling. As calculated using the implant damage model of G. Hobler and S. Selberherr in "Two-Dimensional Modeling of Ion Implantation Induced Point Defects", IEEE Trans. Computer-Aided Design, vol. 7, no. 2, pp. 174–181 (1988), damage from the deep boron implant ($2.0 \times 10^{13}$ cm$^{-2}$, 260 keV) used for latchup suppression in the n-MOSFET is significantly less than damage caused by the phosphorus implant in the p-MOSFET.

As noted above, part of the present process for making trench-bounded buried-channel p-MOSFETS (recipe "A")—comprising the following steps: (1) implanting at least one deep phosphorus n-well; (2) implanting a boron buried-channel; and (3) initiating a 850° C. dry gate oxidation step—results in an anomalous narrow channel behavior.

It has been demonstrated that reduction of the anomalous narrow channel behavior can be achieved by implementing a low temperature annealing step, utilizing an inert gas, immediately following the deep phosphorus implant and prior to the boron buried-channel implant. Alternatively, the low temperature annealing step may be initiated after the boron buried-channel implant and prior to the 850° C. dry gate oxidation step.

The low temperature anneal (referred to as process recipe "B") may be performed at a temperature of between about 750° C. to about 800° C. Temperatures much above 800° C. are undesirable as this will increase phosphorous diffusion. Temperatures much below 750° C. result in reduced interstitial recombination. Regarding the duration of the annealing step, a reduction of the anomalous narrow channel behavior has been observed for periods ranging from about 10 minutes to about 120 minutes. The low temperature anneal is carried out with an inert gas, such as, by way of example and not by limitation, nitrogen or argon.

Figure 4:
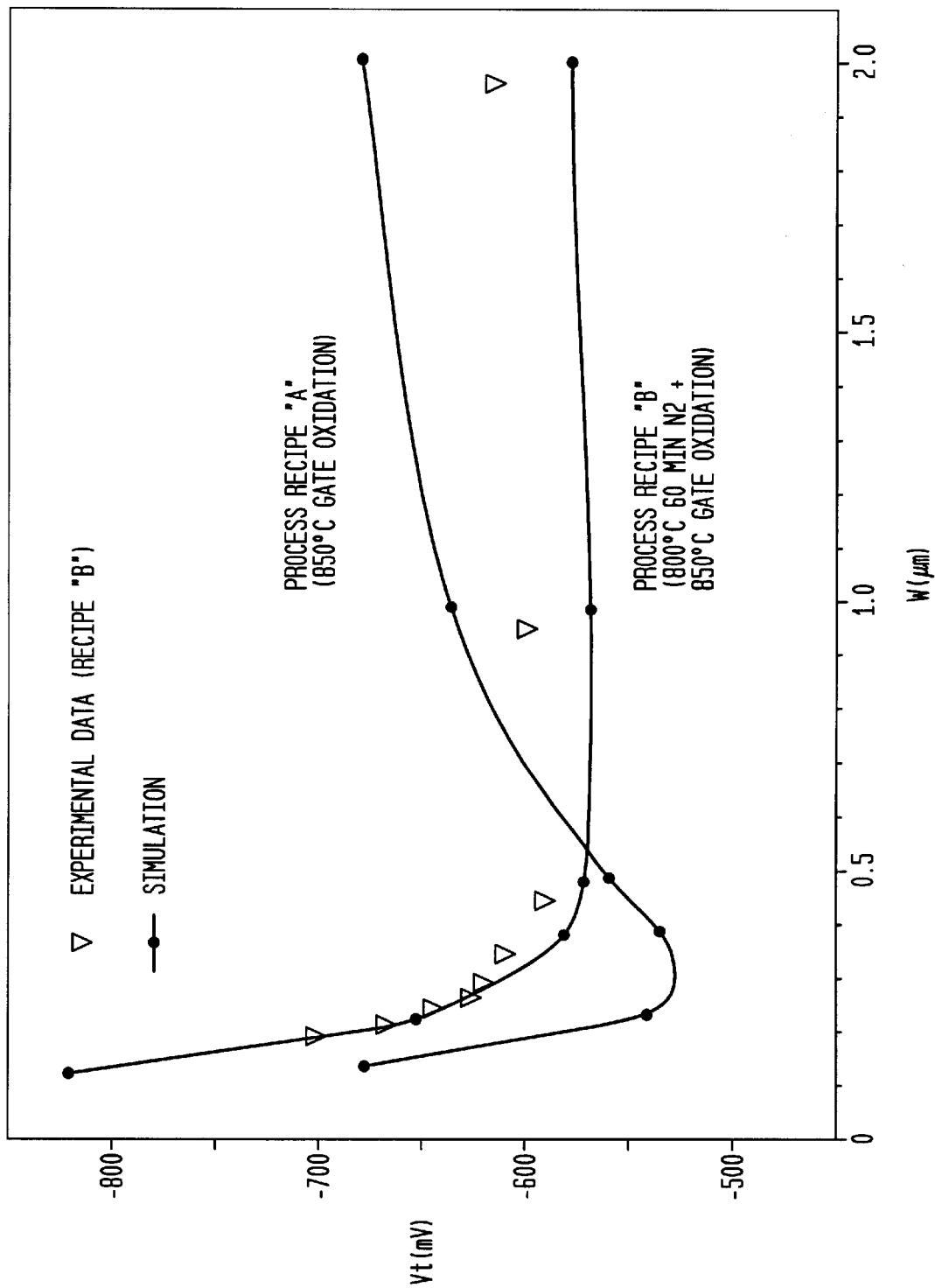
FIG. 4 is a graph showing the effect on the anomalous narrow channel behavior of the solution using process recipe "B" according to the invention.

This annealing process results in rapid excess interstitial recombination on the Si/SiO$_2$ interfaces; thus the transient enhanced diffusion (TED) of boron is greatly reduced during the subsequent 850° C. gate oxidation. FIG. 4 compares the simulated and measured $V_t$ vs. W characteristics for devices fabricated using recipe "B" with simulated behavior using recipe "A" Recipe "B" includes a low temperature anneal at 800° C. for about 60 minutes prior to gate oxidation at 850° C. As shown in FIG. 4, the threshold voltage $V_t$ remains nearly constant as the device width is reduced from about 2 μm to about 0.4 μm. Specifically, the net p-type concentration peaks only 3% above mid-width value for a device width of 2 μm. The normal narrow channel behavior—increased magnitude of $V_t$ with decreasing W—is observed at device widths below about 0.4 μm.

Although the addition of this low temperature inert gas annealing step results in a drastically reduced "boron puddle" it also results in a lower magnitude of wide device $V_t$, since the reduced transient enhanced diffusion (IED) of boron leaves a higher peak net p-type concentration in the buried layer.

DETAILED DESCRIPTION OF ANOTHER EMBODIMENT OF THE INVENTION

In another embodiment of the invention, it has also been demonstrated that reduction of the anomalous narrow channel behavior can be achieved by substituting a rapid thermal oxidation (RTO) step for the 850° C. gate oxidation step (recipe "A") following the deep phosphorous implant. The RTO gate oxidation step (referred to as process recipe "C") is carried out at temperatures ranging from about 1025° C. to about 1075° C. The duration of the RTO gate oxidation step is dependent upon the desired thickness of the gate oxide. For example, for a gate oxide thickness of 80 angstroms, the duration of the RTO gate oxidation step would be about 1.3 minutes.

Alternatively, rather than substitute the RTO gate oxidation step for the 850° C. gate oxidation step, the two can be used in conjunction, with the duration of the RTO step being reduced somewhat to be followed by the 850° C. gate oxidation step.

Figure 5:
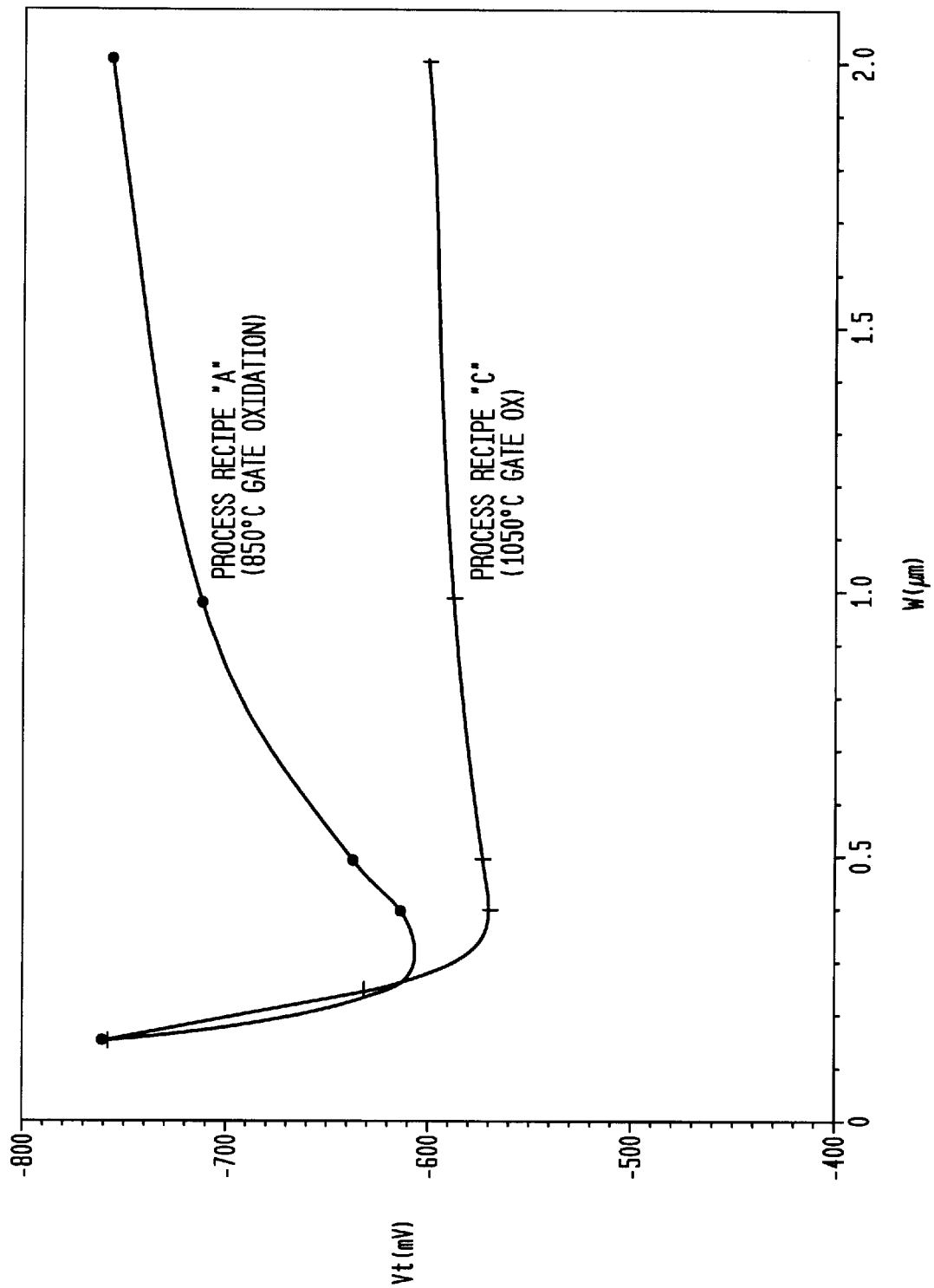
FIG. 5 is a graph showing the effect on the anomalous narrow channel behavior of the solution using process recipe "C" according to the invention.

During the RTO gate oxidation step, transient enhanced diffusion (TED) of boron is negligible, since the excess interstitial concentration is reduced at the elevated temperature. FIG. 5 compares the simulated $V_t$ vs. W characteristics for devices fabricated using recipe "C" with simulated behavior using recipe "A". As shown in FIG. 5, the threshold voltage $V_t$ remains nearly constant as the device width is reduced from about 2 μm to about 0.4 μm. The normal narrow channel behavior is observed at device widths below about 0.4 μm. Simulation shows the magnitude of the "boron puddle" and the anomalous $V_t$ width dependence are negligible for this process.

While the invention has been described in terms of the above embodiments, those skilled in the art will recognize that the invention can be practiced with modification within the spirit and scope of the appended claims.

What is claimed is:

1. In a trench-bounded buried-channel p-MOSFET which exhibits anomalous narrow channel behavior, a method for reducing anomalous narrow channel behavior comprising:

providing a substrate having an n-well bounded by a shallow trench isolation;

forming a buried p-channel in the n-well by implanting boron ions into the n-well; and performing a rapid thermal oxidation (RTO) at a temperature from about 1025° C. to about 1075° C. to form a gate oxide on the substrate, wherein the RTO reduces the migration of boron ions in the buried p-channel toward sidewalls of the shallow trench isolation while the gate oxide is formed in order to reduce anomalous narrow channel behavior so that the gate threshold voltage remains nearly constant as device width is reduced below 2 um without the need of performing an anneal after formation of the n-well and before formation of the gate oxide.

2. The method of claim 1 wherein the duration of the RTO is about 1.3 minutes.

3. The method of claim 1 wherein the RTO is about 1050° C.

4. The method of claim 3 wherein the duration of the RTO is about 1.3 minutes.

5. The method of claim 1, 2, 3, or 4 further comprises performing a gate oxidation after the RTO.

6. The method of claim 5 wherein the gate oxidation is performed at a temperature of about 850 ° C.

* * * * *